United States Patent
Chan et al.

(10) Patent No.: US 9,766,705 B2
(45) Date of Patent: Sep. 19, 2017

(54) STATIONARY INTERFACE CONTROL AND METHOD FOR USING THE SAME

(71) Applicant: MOTOROLA SOLUTIONS, INC., Schaumburg, IL (US)

(72) Inventors: Eng Wiang Chan, Penang (MY); Mohd Wardi Iswali Aihsan, Kedah (MY); Chee Kit Chan, Perak (MY); Shirish Kaner, Penang (MY); Steven John Kerr, Penang (MY)

(73) Assignee: MOTOROLA SOLUTIONS, INC., Chicago, IL (US)

(*) Notice: Subject to any disclaimer, the term of this patent is extended or adjusted under 35 U.S.C. 154(b) by 0 days.

(21) Appl. No.: 14/739,073

(22) Filed: Jun. 15, 2015

(65) Prior Publication Data
US 2016/0364059 A1 Dec. 15, 2016

(51) Int. Cl.
| | |
|---|---|
| G06F 3/01 | (2006.01) |
| G06F 3/0362 | (2013.01) |
| G06F 3/044 | (2006.01) |
| B60K 37/06 | (2006.01) |
| G06F 3/0484 | (2013.01) |
| G06F 3/0354 | (2013.01) |

(52) U.S. Cl.
CPC ............ *G06F 3/016* (2013.01); *B60K 37/06* (2013.01); *G06F 3/0362* (2013.01); *G06F 3/03547* (2013.01); *G06F 3/044* (2013.01); *G06F 3/04847* (2013.01); *G06F 2203/0339* (2013.01); *G06F 2203/04102* (2013.01)

(58) Field of Classification Search
CPC ........... H03K 17/9622; H03K 17/9647; H03K 2217/96066; H03K 2217/960785; G02F 1/1323; G02F 1/133; G02F 1/133606; G02F 2001/133607; G02F 2203/62
See application file for complete search history.

(56) References Cited

U.S. PATENT DOCUMENTS

| | | |
|---|---|---|
| 2009/0009491 A1 | 1/2009 | Grivna |
| 2011/0100353 A1 | 5/2011 | Rauth et al. |
| 2011/0240455 A1 | 10/2011 | Kulczycki et al. |

(Continued)

FOREIGN PATENT DOCUMENTS

WO 2014/046667 3/2014

OTHER PUBLICATIONS

Russell, "Major Touch ID Enhancements Coming, Apple Patent Suggest," article (Dec. 18, 2014) p. 1-4, http://www.technobuffalo.com/2014/12/18/major-touch-id-enhancements-coming-apple-patents-suggest/.

(Continued)

*Primary Examiner* — Nelson Rosario
(74) *Attorney, Agent, or Firm* — Michael Best & Friedrich LLP (57) ABSTRACT

A stationary interface control knob includes a body having a fixed substantially-cylindrical surface with a first axis, and a flexible touch panel sensor having a sensor surface at least partially in cylindrical form with a spaced relationship from the fixed substantially-cylindrical surface. The sensor surface has a second axis coinciding with the first axis. The flexible touch panel sensor senses a user interaction with the fixed substantially-cylindrical surface and generates an interface signal in response thereto. Also discloses are method of controlling the stationary interface control knob.

16 Claims, 6 Drawing Sheets

(56) References Cited

U.S. PATENT DOCUMENTS

| | | | |
|---|---|---|---|
| 2012/0280576 A1 | 11/2012 | Wood | |
| 2013/0292481 A1* | 11/2013 | Filson | G05D 23/1902 236/1 C |
| 2014/0042002 A1 | 2/2014 | Chu | |
| 2014/0267039 A1* | 9/2014 | Curtis | G06F 3/0338 345/161 |
| 2014/0319232 A1 | 10/2014 | Gourlay et al. | |
| 2015/0241195 A1* | 8/2015 | Schenkewitz | H03K 17/975 324/658 |
| 2016/0071652 A1* | 3/2016 | Lyszus | H03K 17/9622 361/287 |
| 2016/0239142 A1* | 8/2016 | Kim | G06F 3/0416 |

OTHER PUBLICATIONS

Mayhew Labs, "Touch Sensitive Rotary Encoder Breakout," user guide (2010) pp. 1-2.
Clark "Preh Teams up with Audi on new TT's high-tech air vents" news article (May 1, 2015) 2 pages, Automotive News, http://europe.autonews.com/article/20150501/CUTAWAY01/150439984/preh-teams-up-with-audi-on-new-tts-high-tech-air-vents.
PCT/US2016/032615 International Search Report and Written Opinion of the International Searching Authority dated Sep. 12, 2016 (15 pages).

* cited by examiner

| INITIAL TOUCH | TURN | IDENT (VALUE CHANGE) | CURRENT MODE | MODE VALUE | MODE CHANGE |
|---|---|---|---|---|---|
| HAPTIC- LOW LEVEL VIBRATION | CONTINUOUS LOW LEVEL HAPTIC FEEDBACK WITH PATTERN SPECIFIC TO THE MODE (VOLUME OR CHANNEL) USER IS IN. | SHORT SHARP HIGHER INTENSITY HAPTIC PULSE. | HAPTIC FEEDBACK (MENTIONED IN TURN), VISUAL INDICATION (VISUAL INTERFACE - DYNAMIC CHANGE - NUMBER FOR CHANNEL, SEGMENTS AROUND RIM FOR VOLUME) | VISUAL INDICATION (VISUAL INTERFACE - DYNAMIC CHANGE - NUMBER FOR CHANNEL, SEGMENTS AROUND RIM FOR VOLUME) | HAPTIC PULSE VISUAL INDICATOR (MENTIONED IN MODE COULD BE MADE BRIGHTER) AUDIO TONE |
| AUDIO - SHORT TONE | AUDIO - CONTINUOUS TONE (SPECIFIC TO THE MODE) | AUDIO - SHORT LOUDER TONE | AUDIO TONE (MENTIONED IN TURN) | VOICE ANNOUNCEMENT | VOICE ANNOUNCEMENT AUDIO TONE |
| VISUAL (LED) | VISUAL (LED) - CONTINUOUS FLASH - COLOR SPECIFIC TO MODE USER IN. | VISUAL (LED) - SHORT PULSE - DIFFERENT COLORED THAN THAT USED FOR TOUCH AND TURN. | VISUAL (LED) (MENTIONED IN TURN) GRAPHIC DISPLAY ELEMENT E.G. ICON | GRAPHIC DISPLAY ELEMENT E.G. ICON / NUMBER | VISUAL (LED) |

STATIONARY INTERFACE CONTROL AND METHOD FOR USING THE SAME

BACKGROUND OF THE INVENTION

Portable and mobile radios, for example, may rely on mechanical switches to control the functionality of volume and channel changing. Mechanical switches are prone to reliability issues after exceeding the useful cyclic usages, and may get damaged after subjecting to multiple drops in the field.

Further, volume and channel switches and knobs usually take up space on the control area and may compromise selection of other interaction elements, such as display and emergency button size. A user may need to deal with aspects such as insufficient torque, inadvertent activation, and aligning eye sight on the marker position to identify the exact state of volume and frequency.

Accordingly, there is a need for a new and useful interface control and method of using the same.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the invention so as not to obscure the disclosure with details that will be readily apparent to those of ordinary skill in the art having the benefit of the description herein.

DETAILED DESCRIPTION OF THE INVENTION

Embodiments provide a three-dimensional and 360-degree cylindrical touch control with user interface information. Basic construction for the control enables user interaction in three-dimensions and 360 degrees, and includes a capacitive sensitive touch panel. The control has virtual rotating, swiping, and tapping. The control can provide a user interface for visual, audio, and haptic feedback through the use of a visual source, an audible source, and a vibration source. The control can be integrated with an electronic device that requires user interfacing, such as a portable or mobile radio.

In embodiments, a stationary interface control includes a knob-like structure having a fixed surface and a first axis, and a flexible touch panel sensor having a sensor surface. The sensor surface at least partially follows in form with the fixed surface. The sensor surface has a second axis coinciding with the first axis. The flexible touch panel sensor senses a user interaction with the fixed surface and generates an interface signal in response thereto. The stationary interface control further includes a controller connected to the flexible touch panel sensor to receive the interface signal and output a control signal based on the interface signal.

In some embodiments, the knob-like structure includes a body having a fixed, substantially-cylindrical surface with the first axis. The body can include a multiple piece body. The sensor surface can substantially form a cylinder paralleling the fixed substantially-cylindrical surface. In other constructions, the stationary interface control includes a plurality of flexible touch panel sensors having a plurality of sensor surfaces, respectively, substantially forming a cylinder paralleling the fixed substantially-cylindrical surface.

The stationary interface control can further include a visual indicator connected to the controller. The control signal controls an output of the visual indicator. The control can also include a vibration source, such as a haptic vibrator, connected to the controller. The controller provides a second control signal to control a vibration of the vibration source. The second control signal is based on the interface signal.

In some embodiments, the body further has a first planar surface perpendicular to the first axis, and the stationary interface control further includes a second touch panel sensor with a second planar surface parallel with the first planar surface. The second touch panel sensor senses a second user interaction with the first planar surface and generates a second interface signal in response thereto. The second touch panel sensor can also be flexible. The controller can receive the second interface signal and output a second control signal based on the second interface signal.

In some constructions, a first visual indicator and a second visual indicator are connected to the controller. The control signal controls a first visual output and the second control signal controls a second visual output.

In some embodiments, a method of controlling a stationary interface control includes providing a knob-like structure having a fixed surface, providing a flexible touch panel sensor having a sensor surface at least partially in form with the fixed surface, sensing a stimulus of the flexible touch panel sensor in response to a user virtually rotating the fixed surface, generating an interface signal in response to the sensing of the stimulus, and controlling a visual indicator based on the interface signal.

In further embodiments, the visual indicator includes a plurality of light emitting diodes and the method includes increasing a number of lit light emitting diodes with the first output and decreasing the number of lit light emitting diodes with the second output. The visual indicator can be a numerical display and the method includes increasing a number of the numerical display with the first output and decreasing the number of the numerical display with the second output.

In yet other embodiments, the method further includes providing a second touch panel sensor having a second planar surface parallel with the first planar surface, sensing a second stimulus of the second touch panel sensor by the user, generating a second interface signal in response to sensing of the second stimulus, and changing a mode of operation for the controller based on the second interface signal. Sensing the second stimulus can include sensing a second stimulus indicating the user tapping the first planar surface.

Figure 1:
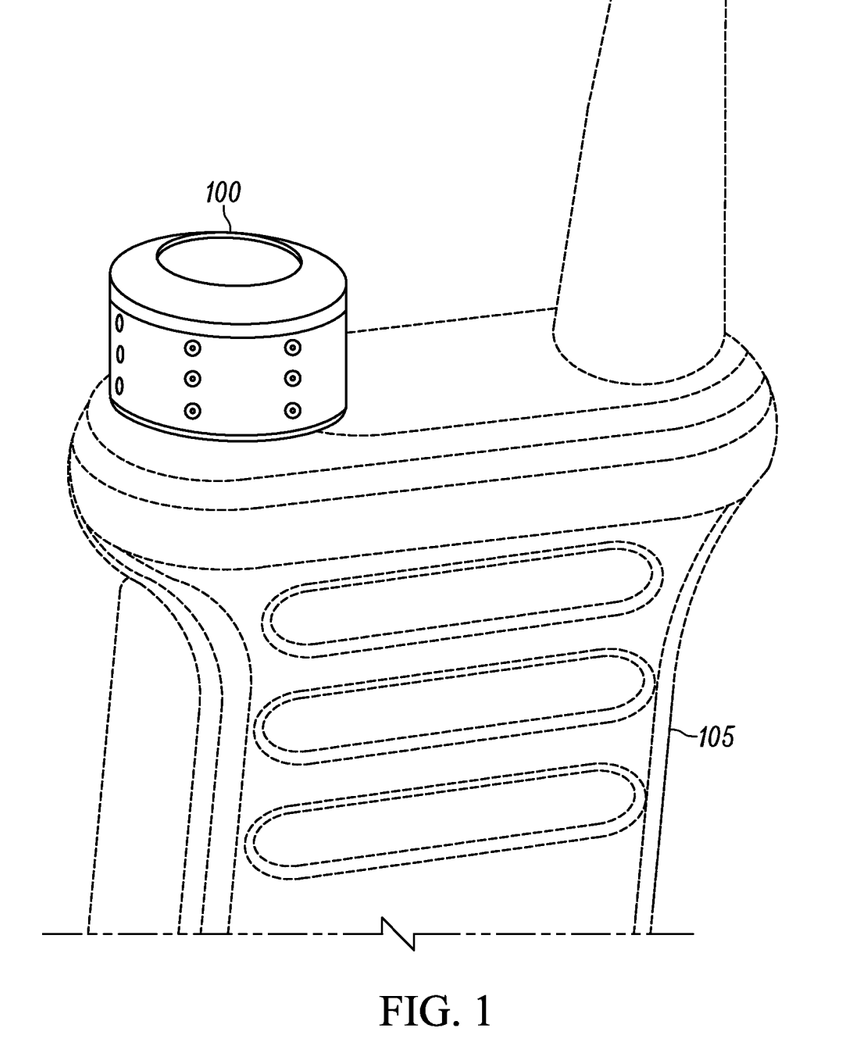
FIG. 1 is a perspective view of a stationary interface knob in context with a portable radio.

FIG. 1 illustrates an electrical device with a stationary interface control. In the example shown in FIG. 1, the electrical device is a portable radio 105 and the control is a stationary interface control knob 100. The stationary interface control is not limited to inclusion with the portable radio in FIG. 1, but can be used with other electrical devices such as other radios, telephones, amplifiers, power tools, large appliances, small appliances, vehicles, etc. The stationary interface control can be used with most any electrical device that requires interfacing with a user.

Figure 2:
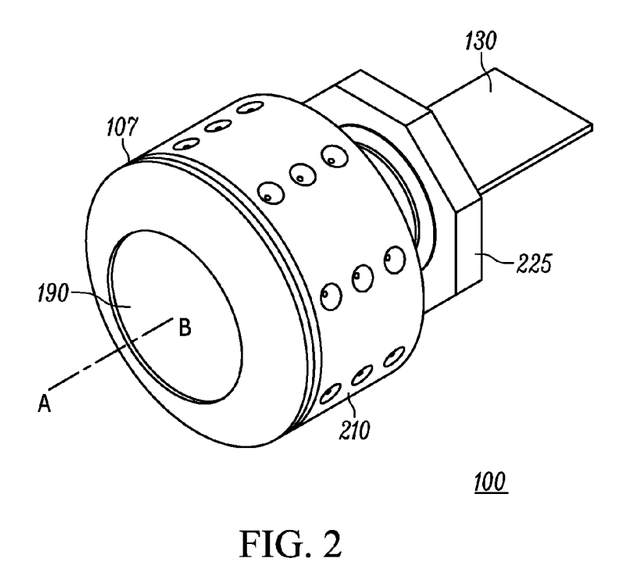
FIG. 2 is an isometric view of the stationary interface knob of FIG. 1.
Figure 3:
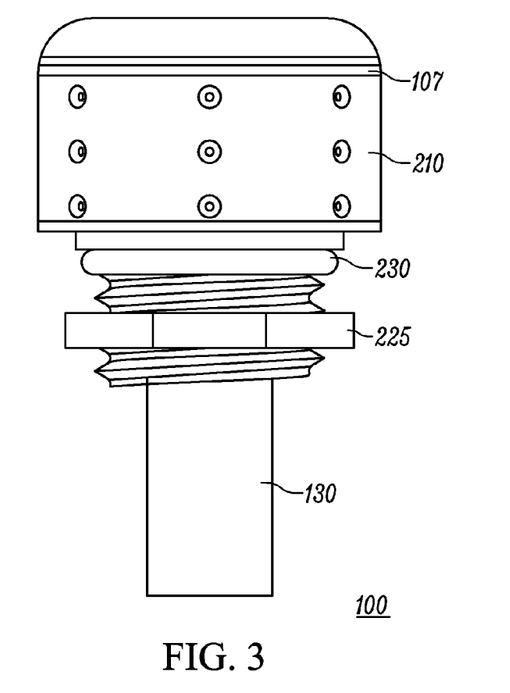
FIG. 3 is a side view of the stationary interface knob of FIG. 1.
Figure 4:
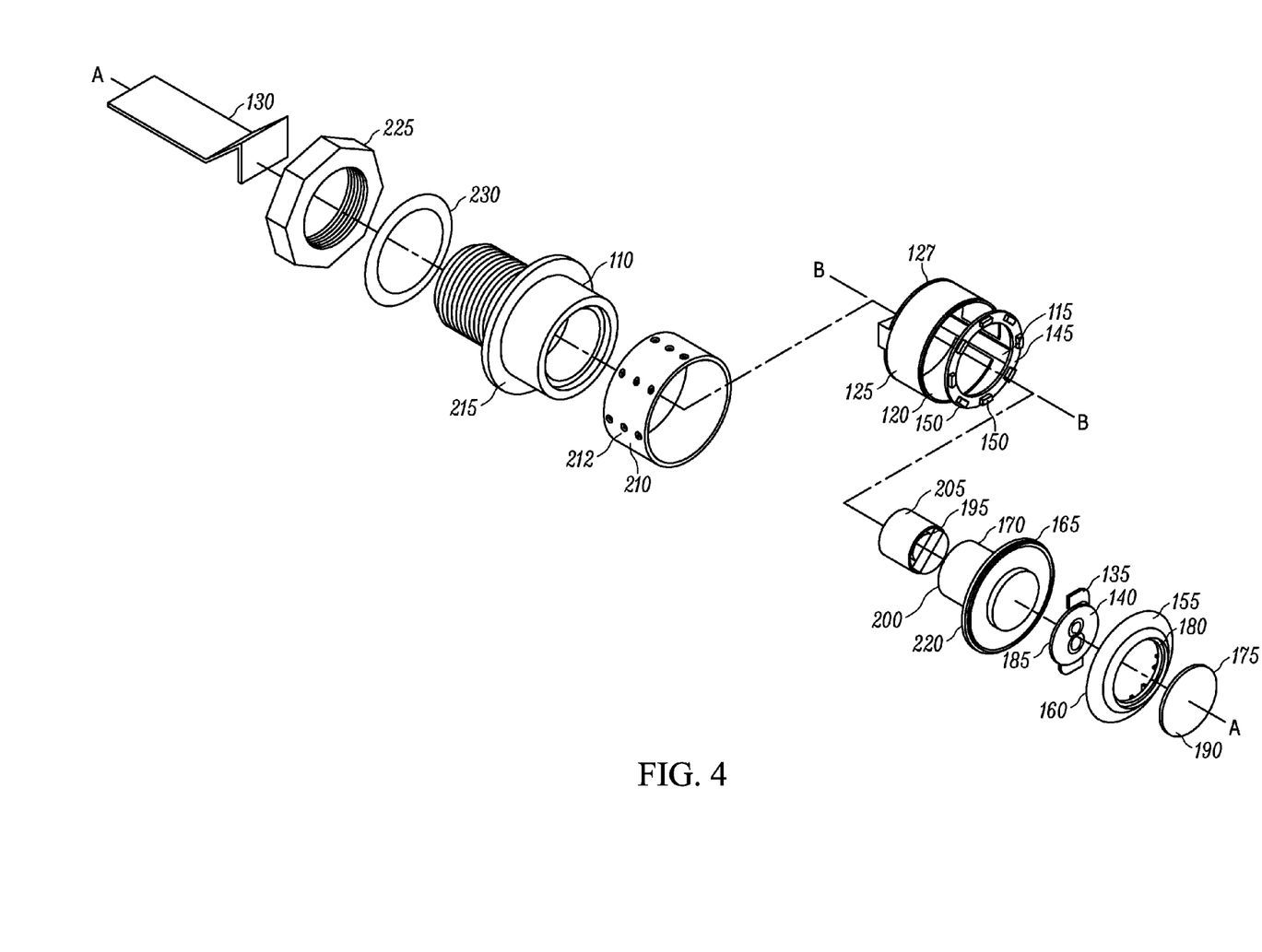
FIG. 4 is an exploded view of the stationary interface knob of FIG. 1.

With reference to FIGS. 2 through 4, the stationary interface control knob 100 has a body 107 including a main base 110 that can be made of plastic resin. The body 107 can be non-unitary and include other components (such as the front cap 155, front cap base 170, and cylindrical touch sleeve 210, discussed below) that may also be made of plastic resin or similar material. A flexible printed circuit (FPC) 115 has a cylindrical shape and is disposed in the main base 110. The flexible printed circuit 115 has a flexible printed circuit board 120 and a flexible touch panel sensor 125. The flexible touch panel sensor 125 includes capacitive touch technology, for example, for multiple point detection when a user interacts with the stationary interface control knob 100, as discussed further herein. Conventional touch panels may be made of indium tin oxide. However, indium tin oxide material is brittle and easily cracks when bent. Alternative conductive touch panel material that might be used with the stationary interface control knob 100 include metal mesh, silver nano wire (SNW), carbon nano tube (CNT) Poly(3,4-ethylenedioxythiophene) (PEDOT), and graphene. These materials can be used for curve or round shape design. Exemplary touch sensor films can include XSENSE brand touch sensors available from ATMEL, UNI-BOSS brand touch sensor film available from UNIPIXEL, and silver nano wire film available from CAMBRIOS. Moreover, while one flexible touch panel sensor 125 is shown in FIG. 4 substantially forming a cylinder, it is envisioned that multiple flexible touch panel sensors can be used together to substantially form the cylinder. The flexible touch panel sensor 125, and more specifically surface 127, has an axis B.

The flexible printed circuit 115 includes a first electrical connection to interface connector 130, an electrical connection to a flexible printed circuit 135 for a front display and touch panel 140, and an electrical connection to a flexible printed circuit 145 that supports light emitting diodes (LEDs) 150. The light emitting diodes 150 provide the user with visual information, e.g., through a color ring. The light emitting diodes 150 might emit multiple colors and other visual sources, e.g., incandescent lights, a liquid crystal display element, etc., can be used in place of the LEDs.

A front cap 155 can be made of a translucent plastic resin with a predefined color. The front cap 155 includes an edge 160 that resides next a shelf 165 of front cap base 170. The front cap 155 can be molded to give an effect, such as to indicate when the user decides to switch from a first mode, e.g. a volume mode, to a second mode, e.g., a channel mode, or vice versa. The glass lens 175 is fastened to a shelf 180 of the front cap 155 with an adhesive, for example.

The flexible printed circuit 135 for the front display and touch panel 140 is fastened to the front cap base 170 with an adhesive, for example. The front display and touch panel 140 includes a touch panel sensor 185 which may be flexible and made of a similar design as the flexible touch panel sensor 125 and is parallel to a surface 190 of the glass lens 175.

A haptic vibrator 195 is optionally disposed in a pocket 200 of the front cap base 170. A rubber bumper 205 can be disposed between the haptic vibrator 195 and front cap base 170 and couple the elements through the use of an adhesive.

A cylindrical touch sleeve 210 can be made of a plastic resin and have a surface 212 with patterns defined to enhance the user's feel. Example patterns include micro dots, dimples, serrations, etc. The patterns provide tactile feedback to inform the user that he/she is interacting with the stationary interface control knob 100. The cylindrical touch sleeve 210 is sleeved over the main base 110 before assembling the front cap base 170. The cylindrical touch sleeve 210, and more specifically the surface 212, includes an axis A, and is held in place by shelves 215 and 220. The axis A coincides with the axis B of the flexible touch panel sensor 125. Further, the cylindrical touch sleeve 210 is shown as being cylindrical, however it is envisioned that the sleeve may be non-cylindrical, e.g., have ridges or edges, for more tactile feel, or even more complex shapes, such as including a partially spherical shape.

The main base 110 can include a D-slot for ease of assembly to an electrical device, e.g., portable radio 105. A collar nut 225 and an O-ring 230 provide a fastener for fastening the stationary interface control knob 100 to the electrical device. The sealing interfaces using an adhesive, above, can alternatively be sealed through ultrasonic welding or a combination of adhesive and ultrasonic welding.

One method of assembling the interaction element can include first creating a first subassembly of combining glass lens 175 to the front cap 155, and a second subassembly of the flexible printed circuits 115 and 135 to front cap base 170. Next, the first subassembly can be fastened to the second subassembly, resulting in a third subassembly. The first and second subassemblies can be fastened by an ultrasonic welding process, for example. Next, the haptic vibrator 195 and rubber bumper 205 can be fastened (e.g., adhered) to the third subassembly, resulting in a fourth subassembly. The flexible printed circuit 115 is then fastened to main base 110. Optionally, the flexible printed circuit 115 can include a board-to-board connection to enable assembly of flexible printed circuits 115, 130, and 135 to one another. Cylindrical touch sleeve 210 is sleeved over the main base 110 before ultrasonic welding the front cap base 170 to the main base 110, thereby resulting in a fifth subassembly. The fifth subassembly is then assembled with O-ring 230. Collar nut 225 is then used to secure the stationary interface control knob 100 to the electrical device.

Figure 5A:
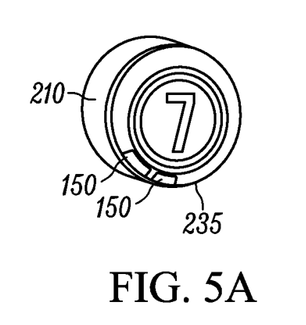
FIGS. 5A and 5B shows first and second scenarios of the stationary interface knob of FIG. 1 in a first operation.
Figure 5B:
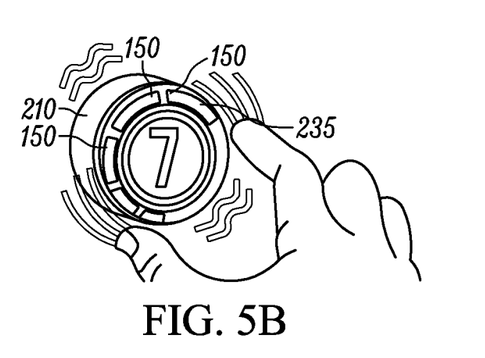

During one operation, a user virtually rotates the cylindrical touch sleeve 210, which is fixed, to adjust a first setting, e.g., change volume. In some implementations, the virtual rotation needs to be accomplished by multiple contacts with the touch sleeve, e.g., two or more fingers, to result in input to the circuit. This limits accidental activation due to user movement. A first indicator can provide the user feedback. The indicator can be visual, audible, or haptic. For example and with reference to FIGS. 5A and 5B, the light emitting diodes 150 of a color ring 235 can change from a first state of two activated LEDs (FIG. 5A) to a second state of five activated LEDs (FIG. 5B). While virtually rotating the cylindrical touch sleeve 210, the haptic vibrator 195 can provide haptic feedback (e.g., a vibration) to the user.

Figure 6A:
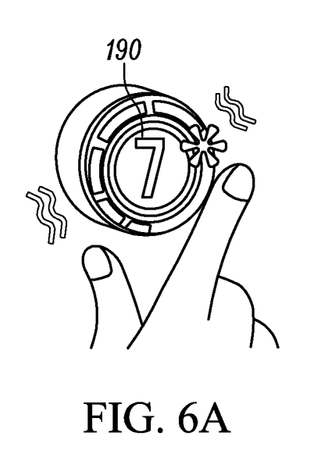
FIGS. 6A and 6B shows first and second scenarios of the stationary interface knob of FIG. 1 in a second operation.
Figure 6B:
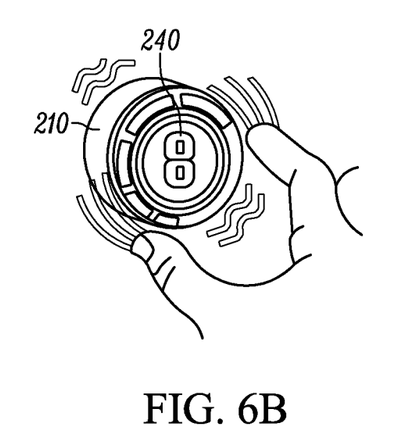

During a second operation and as shown in FIGS. 6A and 6B, the user can tap the surface 190 to adjust a second setting (shown in FIG. 6A), e.g., to change a mode of operation. Alternatively, the user can slide or swipe the surface 190 to change the mode of operation. For example, the mode of operation can change from a volume control mode to a channel control for the portable radio 105. When the mode of operation changes, the user can change a channel setting by virtually rotating the cylindrical touch sleeve 210. A second visual indicator 240 can provide feedback to the user. For example, the second visual indicator 240 can be a numerical display that changes numeric values in response to the virtual rotation of the cylindrical touch sleeve 210. While virtually rotating the cylindrical touch sleeve 210, the haptic vibrator 195 can provide pulsed haptic feedback to the user.

In the two operations discussed, the interaction element provides visual and haptic feedback to the user. The visual feedback can be differentiated by color and form (e.g., the LEDs and the numerical display) to the user. Further haptic feedback can be provided by a length of the haptic pulse or an amplitude of the pulse.

It is also envisioned, that the stationary interface control knob 100 can include, in some embodiments, an audible output for providing audible feedback to the user. Audio feedback can be provided through different tones (e.g., for the change in mode of operation) and varying tone lengths (e.g., for increasing or decreasing mode values). Alternatively, audio, haptic, and visual feedback can be provided by the electrical device coupled to the stationary interface control knob 100. For example, the portable radio 105 can include a speaker for providing audible feedback to the user. The multiple means for feedback offer redundancy to the user, thereby providing status information more readily to the user.

In a third operation, the stationary interface control knob 100 can include an inactive mode, which might result in no output by the stationary interface control knob 100. An active mode may be entered when the user performs an action to the stationary interface control knob 100. For example, the stationary interface control knob 100 can enter an active mode of operation when the user taps the surface 190 (FIG. 6A). For a more specific example, the stationary interface control knob 100 can enter the volume control mode when the user taps the surface 190 one time within a time period and enter the channel control mode when the user taps the surface 190 two times within the time period. The stationary interface control knob 100 can return to the inactive mode if the knob 100 senses no stimulus from the user within a second time period.

In a fourth operation, the stationary interface control knob 100 can include a default mode in place of the inactive mode. The default mode allows the user not to have to think about which mode she is in. Accidental virtual rotation of the stationary interface control knob 100 in a default mode does not provide critical operation change. For example, the default mode may be the volume control mode and an accidental virtual rotation of the stationary interface control knob 100 results in a noncritical change, such as a change in volume; but the knob 100 still requires the user to tap the surface 190 to change to a more critical mode of operation, e.g., channel control mode. The more critical channel change, for example, which does not happen too frequently, requires a dedicated action by the user. The stationary interface control knob 100 returns to the default mode if no stimulus is sensed in a defined time period.

Figure 7:
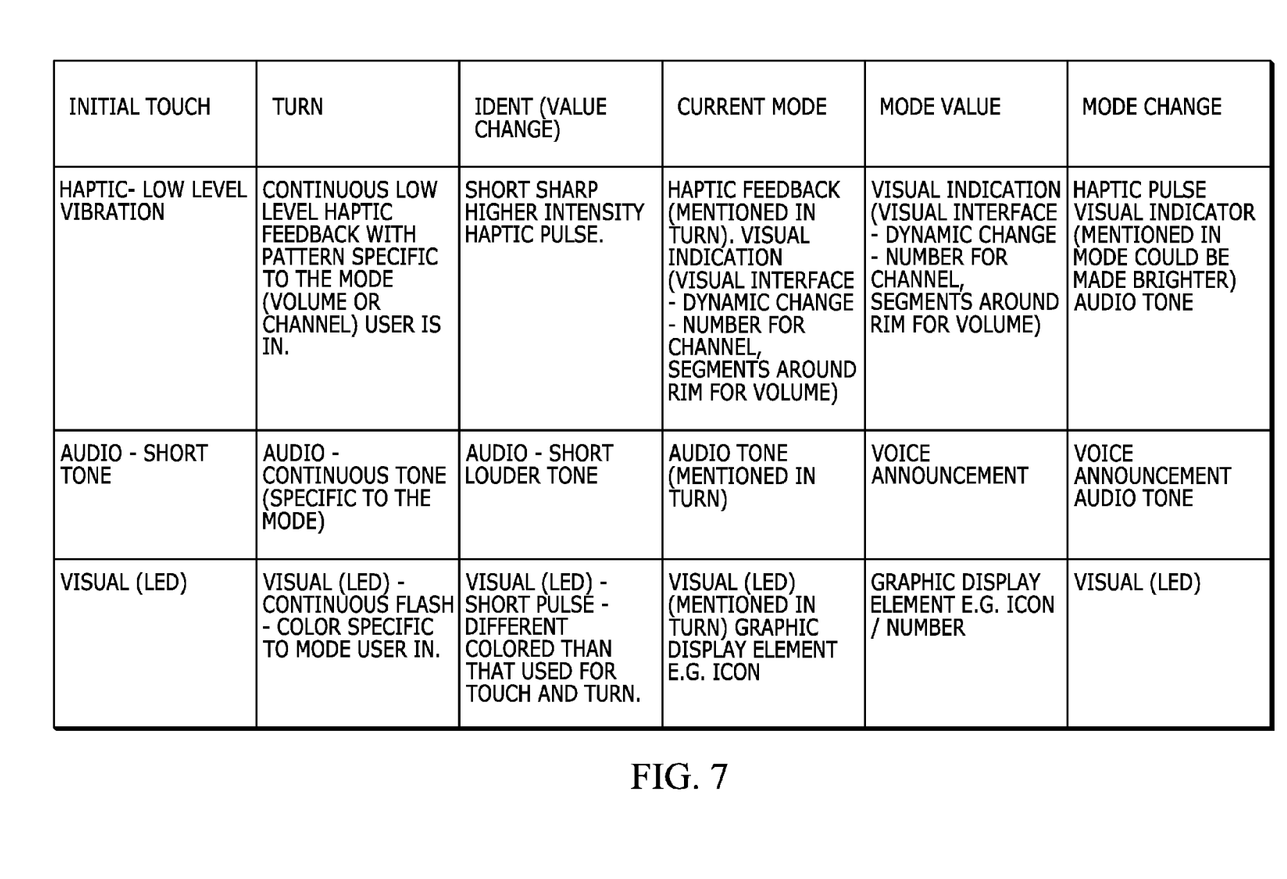
FIG. 7 is a table providing exemplary detailed responses for the stationary interface control knob of FIG. 1

FIG. 7 provides an exemplary detailed control table for the stationary interface control knob 100 when used with the portable radio 105 of FIG. 1. Each response (i.e., cell) is not required during operation; rather the cells provide a menu of options that can be mixed and matched depending on the desired response to user action. The table of FIG. 7 assumes the stationary interface control knob changes operational modes between volume control and channel control, and controls volume level and channel selection. The table rows provide the haptic, audio, and visual response to the sensed user action by the stationary interface control knob 100. The column "Initial Touch" refers to the user performing an initial touch to the stationary interface control knob 100 after an inactive period (e.g., no touch in the prior 10 seconds). The column "Turn" refers to the user virtually rotating the cylindrical touch sleeve 210. The column "Ident" refers to the response while the user causes a change in a mode value, e.g., to cause an increase or decrease in the volume value. The column "Mode Change" refers to the response while the user causes a change in the mode of operation. The column "Current Mode" refers to the feedback or provided response when the current mode is identified to the user. The column "Mode Value" refers to feedback or provided response when the mode value is identified to the user.

Figure 8:
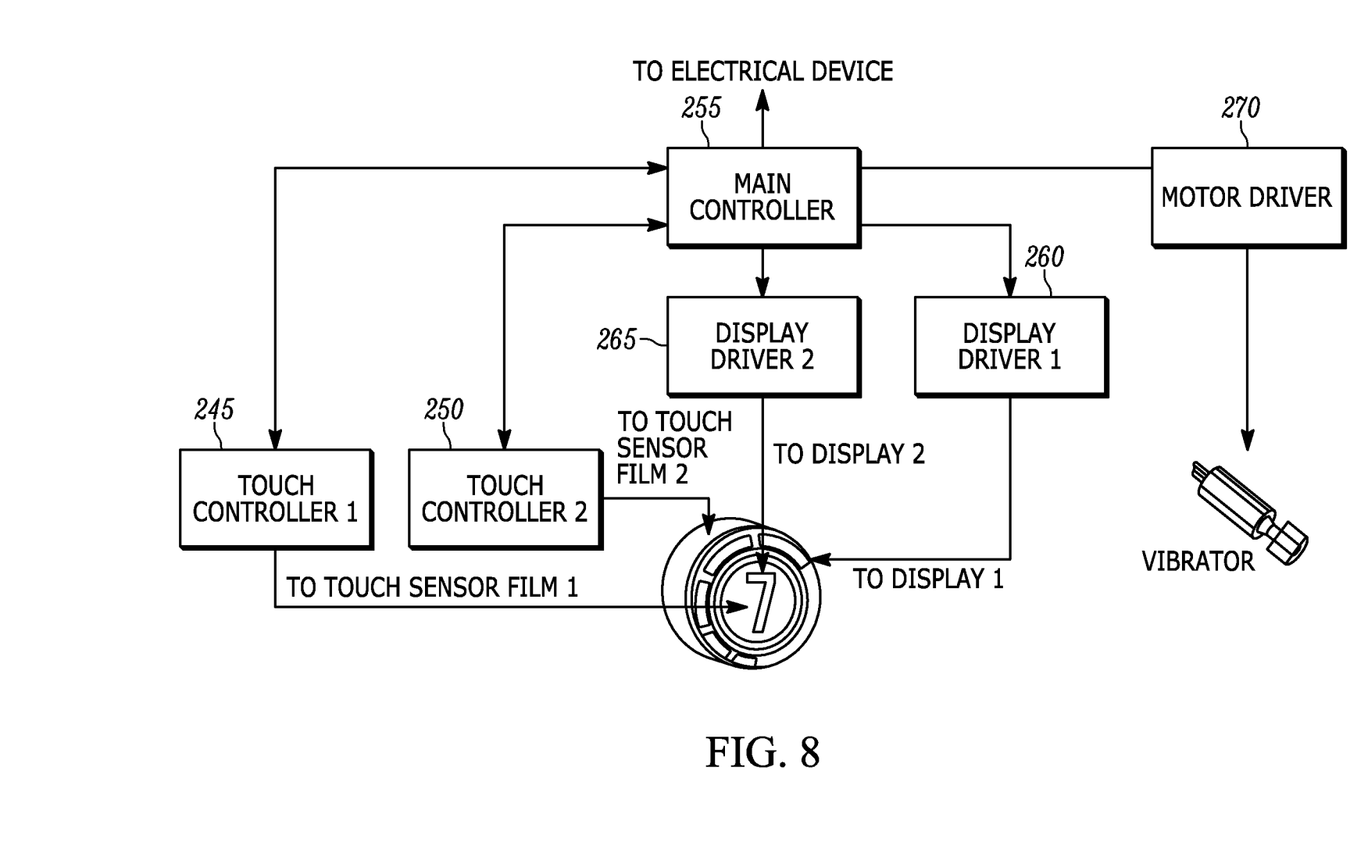
FIG. 8 is a block diagram of the electrical components used in the stationary interface knob of FIG. 1.

FIG. 8 provides a block diagram for the electrical elements of the stationary interface control knob 100. A first touch controller 245 is coupled to the touch panel sensor 185. A second touch controller 250 is coupled to the flexible touch panel sensor 125. The touch controllers 245 and 250 provide the necessary electrical stimulus to charge the sensors 185 and 125, respectively, sense the touch stimulus provided by the user, and provide respective interface signals to the main controller 255. Exemplary flexible touch panel sensors were provided above and controllers for controlling the touch sensors are available from the referenced manufacturers for the touch sensors.

The main controller 255 provides control signals to a first display driver 260 for driving the light emitting diodes 150, a second display driver 265 for driving the front display panel, and a motor driver 270 for driving a motor of the haptic vibrator 195. The drivers 260, 265, and 270 are conventional drivers for the output indicators. Control signals are also provide to the electrical device, e.g., the portable radio 105, based on the mode of operation, setting, and stimulus of the stationary interface control knob 100. For example, the portable radio 105 receives control signals from the stationary interface control knob 100 for controlling a volume and channel of the portable radio 105.

The main controller 255 can include a processor and memory. The memory includes program instructions for execution by the processor and operational data related thereto. The executed instructions enable the controller to, among other things, provide operational control for the stationary interface control knob 100 as discussed herein. The main controller 255 can include a plurality of electrical and electronic components that provide, power, operational control, and protection to the stationary interface control knob 100. The processor can be a microprocessor, a microcontroller, or another suitable programmable device. The memory includes, for example, a read-only memory (ROM), a random access memory (RAM), an electrically erasable programmable read-only memory (EEPROM), a flash memory, a hard disk, or another suitable magnetic, optical, physical, or electronic memory device. The processor is connected to the memory and executes software that is capable of being stored in the random access memory (e.g., during execution), the read-only memory (e.g., on a generally permanent basis), or another non-transitory computer readable medium. The software includes, for example, firmware, one or more applications, program data, one or more program modules, and other executable instructions.

The main controller 255 can include, among other things, a plurality of additional passive and active components such as resistors, capacitors, inductors, integrated circuits, and amplifiers. These components are arranged and connected to provide a plurality of electrical functions to the main controller 255 including, among other things, filtering, signal conditioning, encoding, decoding, or voltage regulation.

While a specific example was given for two modes of operation with two indicators, it is envisioned that the interaction element can include many more modes and alternative ways for providing feedback to the user. The types of modes of operation can vary depending on the electrical device the stationary interface control knob 100 is coupled. For example, the modes of operation will be different between the portable radio 105 and a control of an automobile feature.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A stationary interface control comprising:
  a knob-like structure including a body having a fixed, substantially-cylindrical surface, a first axis, and a first planar surface perpendicular to the first axis;
  a first capacitive touch panel sensor with a second planar surface being parallel with the first planar surface, the first capacitive touch panel sensor generating a first interface signal in response to a touch;
  a second capacitive touch panel sensor having a sensor surface substantially forming a cylinder paralleling the fixed, substantially-cylindrical surface and having a second axis coinciding with the first axis, the second capacitive touch panel sensor generating a second interface signal in response to a virtual rotation;

a haptic vibrator; and a controller connected to the first capacitive touch panel sensor, the second capacitive touch panel sensor, and the haptic vibrator, and configured to receive the first interface signal and output a first control signal based on the first interface signal; and receive the second interface signal and output a second control signal based on the second interface signal;

wherein the haptic vibrator produces a first vibration indicative of a mode of operation in response to the first control signal;

and the haptic vibrator produces a second vibration different from the first vibration and indicative of a change in a mode value in response to the second control signal.

2. The stationary interface control of claim 1, wherein the sensor surface provides 360 degree cylindrical touch control.

3. The stationary interface control of claim 1, and further comprising a plurality of capacitive touch panel sensors having a plurality of sensor surfaces, respectively, substantially forming a cylinder paralleling the fixed, substantially-cylindrical surface.

4. The stationary interface control of claim 1, wherein the body includes a multiple piece body.

5. The stationary interface control of claim 1, and further comprising a visual indicator connected to the controller and wherein the first control signal controls an output of the visual indicator.

6. The stationary interface control of claim 1, and further comprising a first visual indicator connected to the controller and a second visual indicator connected to the controller, wherein the first control signal controls a first visual output and the second control signal controls a second visual output.

7. The system of claim 1, wherein the touch is one selected from a group consisting of a touch and a swipe.

8. The system of claim 1, wherein the mode of operation is one selected from a group consisting of a volume control mode, a channel control mode, and an inactive mode.

9. The system of claim 1, wherein the mode of operation is one selected from a group consisting of a volume control mode, a channel control mode, and an inactive mode.

10. A method of controlling a stationary interface control, the method comprising:

providing a knob-like structure including a body having a fixed, substantially-cylindrical surface;

providing a first capacitive touch panel sensor having a second planar surface parallel with the first planar surface, providing a second capacitive touch panel sensor having a sensor surface substantially forming a cylinder paralleling the fixed, substantially-cylindrical surface;

generating a first interface signal in response to a touch of the first planar surface;

generating a second interface signal in response to a virtual rotation of the fixed surface;

controlling a haptic vibrator to produce a first vibration indicative of a mode of operation based on the first interface signal; and controlling the haptic vibrator to produce a second vibration different from the first vibration and indicative of a change in a mode value based on the second interface signal.

11. The method of claim 10, wherein generating a second interface signal in response to a virtual rotation of the fixed surface includes sensing a first stimulus indicating a virtual rotation of the fixed surface in a first virtual rotational direction and sensing a second stimulus indicating a virtual rotation of the fixed surface in a second virtual rotational direction different from the first virtual rotational direction.

12. The method of claim 11, further comprising:

controlling a visual indicator with a first output in response to sensing a first stimulus; and controlling the visual indicator with a second output in response to sensing a second stimulus.

13. The method of claim 12, wherein the visual indicator includes a plurality of light emitting diodes and controlling the visual indicator includes increasing a number of lit light emitting diodes with the first output and decreasing the number of lit light emitting diodes with the second output.

14. The method of claim 12, wherein the visual indicator includes a numerical display and controlling the visual indicator includes increasing a number of the numerical display with the first output and decreasing the number of the numerical display with the second output.

15. The method of claim 10, wherein generating a first interface signal in response to a touch of the first planar surface includes sensing a first stimulus indicating a tapping of the first planar surface.

16. The method of claim 10, wherein generating a first interface signal in response to a touch of the first planar surface includes sensing a first stimulus indicating a swiping of the first planar surface.

\* \* \* \* \*